United States Patent
Yoon et al.

(10) Patent No.: US 7,528,820 B2
(45) Date of Patent: May 5, 2009

(54) DRIVING CIRCUIT INCLUDING SHIFT REGISTER AND FLAT PANEL DISPLAY DEVICE USING THE SAME

(75) Inventors: Soo-Young Yoon, Goyang-si (KR); Yong-Ho Jang, Seongnam-si (KR); Binn Kim, Seoul (KR); Soo-Hwan Moon, Gumi-si (KR)

(73) Assignee: LG. Display Co., Ltd., Seoul (KR)

( * ) Notice: Subject to any disclaimer, the term of this patent is extended or adjusted under 35 U.S.C. 154(b) by 663 days.

(21) Appl. No.: 11/172,232

(22) Filed: Jun. 29, 2005

(65) Prior Publication Data

US 2006/0139292 A1 Jun. 29, 2006

(30) Foreign Application Priority Data

Dec. 28, 2004 (KR) .................. 10-2004-0113684

(51) Int. Cl.
G09G 3/36 (2006.01)
(52) U.S. Cl. .................................... 345/100
(58) Field of Classification Search ................ 345/100, 345/98–99, 87, 204
See application file for complete search history.

(56) References Cited

U.S. PATENT DOCUMENTS 5,701,136 A * 12/1997 Huq et al. ................. 345/100
6,300,928 B1 * 10/2001 Kim .......................... 345/92
2002/0186196 A1 * 12/2002 Park ........................ 345/100
2003/0128180 A1 * 7/2003 Kim et al. ................ 345/100
2005/0264514 A1 * 12/2005 Kim et al. ................ 345/100

FOREIGN PATENT DOCUMENTS

| JP | 08-263028 | 10/1996 |
|---|---|---|
| JP | 2001-052494 | 2/2001 |
| WO | WO 02065062 A2 * | 8/2002 |

OTHER PUBLICATIONS

Copy of Office Action issued in corresponding Japanese Patent Application No. 2005-183225; mailed Jul. 7, 2008.

* cited by examiner

*Primary Examiner*—Amr Awad
*Assistant Examiner*—Stephen G Sherman
(74) *Attorney, Agent, or Firm*—Brinks Hofer Gilson & Lione

(57) ABSTRACT

A driving circuit for a flat panel display device includes shift register stages, each containing: a first TFT charging a Q node according to a start signal; a second TFT discharging the Q node according to an output voltage of a next shift register stage; a pull-up unit increasing an output voltage according to the Q node voltage; an odd pull-down unit decreasing the output voltage in an odd frame according to a QB-o node voltage; and an even pull-down unit decreasing the output voltage in an even frame according to a QB-e node voltage. A gate and drain of a third odd TFT connected to the QB-o node are connected to each other and receive an odd source voltage. A gate and drain of the third even TFT connected to the QB-e node are connected to each other and receive an even source voltage.

32 Claims, 11 Drawing Sheets

US 7,528,820 B2

DRIVING CIRCUIT INCLUDING SHIFT REGISTER AND FLAT PANEL DISPLAY DEVICE USING THE SAME

PRIORITY CLAIM

The present invention claims the benefit of Korean Patent Application No. 2004-0113684, filed in Korea on Dec. 28, 2004, which is hereby incorporated by reference.

FIELD OF THE INVENTION

The present invention relates to a driving circuit for a flat panel display device, and more particularly, to a driving circuit having a shift register and a flat panel display device using the same.

DISCUSSION OF THE RELATED ART

Cathode ray tubes (CRTs) have been widely used for display devices such as a television and a monitor. However, the CRTs have some disadvantages, for example, heavy weight, large volume and high driving voltage with increasing display area. Accordingly, flat panel display (FPD) devices, such as liquid crystal display (LCD) devices, plasma display panel (PDP) devices and organic electroluminescent display (ELD) devices, having excellent characteristics of light weight and low power consumption have been the subject of recent research.

In general, an LCD device includes two substrates disposed such that respective electrodes of the two substrates face each other. A liquid crystal layer is interposed between the respective electrodes. When a voltage is applied between the two electrodes, an electric field is generated. The electric field modulates the light transmittance of the liquid crystal layer by reorienting the liquid crystal molecules, thereby displaying images in the LCD device.

FPD devices such as LCD devices include a circuit unit converting RGB data and several control signals of an external driving system into proper electric signals, and a display panel displaying images using the electric signals. In general, the circuit unit is formed on a substrate different from the display panel, and includes a gate driver and a data driver.

Recently, an active matrix type display panel where a plurality of pixel regions are disposed in matrix and a switching element such as a thin film transistor (TFT) is formed in each pixel region is widely used. The TFT is fabricated through the repetition of photolithographic processes. While the TFT in the pixel region is fabricated, a part of a driving circuit may be formed at the periphery of the pixel region. Since the driving circuit is partially formed in the display panel without the increase of photolithographic processes, a fabrication cost is reduced. Specifically, a gate driver having a relatively low driving frequency may be formed in the display panel with a high reliability.

FIG. 1 is a schematic plan view showing an active matrix type liquid crystal display device according to the related art. In FIG. 1, an active matrix type liquid crystal display device includes a liquid crystal panel 3, a data driving integrated circuit (IC) 1 and a gate driving IC 2. The liquid crystal panel 3 includes two substrates and a liquid crystal layer interposed between the two substrates. A plurality of data lines "DL1" to "DLn" and a plurality of gate lines "GL1" to "GLm" are formed in the liquid crystal panel 3 to define a plurality of pixel regions and a thin film transistor (TFT) in each pixel region is connected to the gate line and the data line. The data driving IC 1 supplies data signals to the TFT through the plurality of data lines "DL1" to "DLn" and the gate driving IC 2 sequentially supplies gate signals to TFT through the plurality of gate lines "GL1" to "GLm." The TFT supplies the data signals to each pixel region according to the gate signals.

The data driving IC 1 including a shift register and a latch shifts a data bit stream according to a data shift clock and supplies the data signals corresponding to one gate line to the plurality of data lines "DL1" to "DLn" according to a data output enable signal at the same time. The gate driving IC 2 including a plurality of stages sequentially supplies the gate signals to the plurality of gate lines "GL1" to "GLm" according to a gate start pulse (GSP).

FIG. 2 is a schematic timing chart showing gate signals for an active matrix type liquid crystal display device according to the related art. In FIG. 2, after a gate start pulse (GPS) is applied to a gate driving IC 2 (of FIG. 1), the gate driving IC 2 (of FIG. 1) begins to sequentially supply gate signals "VGLm-2," "VGLm-1" and "VGLm" to a plurality of gate lines "GLm-2," "GLm-1" and "GLm" (of FIG. 1). Accordingly, a plurality of thin film transistors (TFTs) connected to the plurality of gate lines are sequentially turned on and the data signals corresponding to one gate line are supplied to the pixel regions connected to selected gate line at the same time.

The gate driving IC 2 (of FIG. 1) includes a plurality of shift registers for sequentially outputting the gate signals. When the plurality of shift registers include an amorphous silicon (a-Si) TFT, the a-Si TFT may be deteriorated due to a high direct current (DC) bias for a long time period. The deterioration of the a-Si TFT may cause a malfunction of the gate driving IC 2 (of FIG. 1).

FIG. 3 is a schematic circuit diagram showing an $N^{th}$ stage of a shift register for a liquid crystal display device according to the related art and FIG. 4 is a schematic timing chart showing signals for driving a shift register of FIG. 3.

In FIGS. 3 and 4, an $N^{th}$ stage of a shift register includes first to seventh thin film transistors (TFTs) "T1" to "T7," and first to fourth clocks "CLK1" to "CLK4" and a start signal "Vst-N" are input to the Nth stage. Amorphous silicon (a-Si) thin film transistors (TFTs) are used as each of the TFTs.

The start signal "Vst-N" and the fourth clock "CLK4" are input to the first TFT "T1" and the second TFT "T2," respectively. An output signal of an $(N-1)^{th}$ stage of the shift register may be used as the start signal "Vst-N" for the $N^{th}$ stage. While high level voltages of the start signal "Vst-N" and the fourth clock "CLK4" are applied to the first TFT "T1" and the second TFT "T2," the first TFT "T1" and the second TFT "T2" are turned on and a Q node is charged up according to the start signal "Vst-N." As a result, the high level voltage of the start signal "Vst-N" bootstraps the Q node. The start signal "Vst-N" and the fourth clock "CLK4" synchronize with each other. Accordingly, while a high level voltage of the first clock "CLK1" is input to the sixth TFT "T6," the Q node has a high level voltage to turn on the sixth TFT "T6" and the high level voltage of the first clock "CLK1" is output as an output signal "Vout-N" of the $N^{th}$ stage. The output signal "Vout-N" of the $N^{th}$ stage may be used as a start signal "Vst-(N+1)" for an $(N+1)^{th}$ stage.

Next, while a high level voltage of the second clock "CLK2" is input to the fourth TFT "T4," the fourth TFT "T4" is turned on and a high level voltage of a source voltage "VDD" is applied to a QB node. As a result, the third TFT "T3" is turned on and the Q node is discharged.

In the shift register, the first to seventh TFTs "T1" to "T7" have different bias stresses. Since the bias stress causes a threshold voltage shift, the first to seventh TFTs "T1" to "T7" have different threshold voltages. The non-uniformity in threshold voltage reduces reliability of TFTs. Specifically, since the third and seventh TFTs "T3" and "T7" turned on/off according to the voltage "VQB" of the QB node are used as elements for a pull-down unit, one-directional bias stress is inflicted on the third and seventh TFTs "T3" and "T7" during one frame except a time period for the output signal "Vout-N." As a result, the threshold voltage shift occurs in the third and seventh TFTs "T3" and "T7" to reduce reliability of the shift register. To improve the reliability of the shift register, the variation in characteristics of TFTs such as the threshold voltage shift should be minimized.

FIG. 5 is a view showing a fourth thin film transistor and signals of a shift register including one pull-down unit according to the related art.

In FIG. 5, a fourth TFT "T4" has a gate electrode "G," a source electrode "S" and a drain electrode "D." A third clock "CLK3" and a source voltage "VDD" are applied to the gate electrode "G," and the drain electrode "D," respectively. The source electrode is connected to a QB node. When a high level voltage of the third clock "CLK3" is applied to the gate electrode "G," high level voltages of the source voltage "VDD" and the QB node voltage "VQB" are applied to the drain electrode "D" and the source electrode "S," respectively. Accordingly, voltage differences between the gate electrode "G" and the source electrode "S" and between the gate electrode "G" and the drain electrode "D" are minimized. Since stress due to the voltage differences is relatively low, this state may be referred to as a low bias stress condition.

SUMMARY OF THE INVENTION

A field sequential mode liquid crystal display device having an improved contrast ratio and an improved color reproducibility, and a driving method thereof is presented. The field sequential mode liquid crystal display device has an improved display quality at a relatively low temperature.

As embodied and broadly described, a shift register of a driving circuit for a flat panel display device having a plurality of stages includes: a first TFT receiving an output voltage of a previous stage and connected to a Q node, the first TFT having a diode structure such that a gate electrode is connected to a drain electrode; a second TFT between the Q node and a supply voltage terminal, the second TFT switched according to an output voltage of a next stage; a third odd TFT between an odd source voltage terminal and a QB-o node, the third odd TFT having a diode structure such that a gate electrode is connected to a drain electrode; a third even TFT between an even source voltage terminal and a QB-e node, the third even TFT having a diode structure such that a gate electrode is connected to a drain electrode; a fourth TFT between a first clock terminal and an output voltage terminal of a present stage, the fourth TFT switched according to a voltage of the Q node; a fifth odd TFT between the QB-o node and the supply voltage terminal, the fifth odd TFT switched according to the voltage of the Q node; a fifth even TFT between the QB-e node and the supply voltage terminal, the fifth even TFT switched according to the voltage of the Q node; a sixth odd TFT between the QB-o node and the supply voltage terminal, the sixth odd TFT switched according to the odd source voltage terminal; a sixth even TFT between the QB-e node and the supply voltage terminal, the sixth even TFT switched according to the even source voltage terminal; a seventh odd TFT between the Q node and the supply voltage terminal, the seventh odd TFT switched according to a voltage of the QB-o node; a seventh even TFT between the Q node and the supply voltage terminal, the seventh even TFT switched according to a voltage of the QB-e node; an eighth odd TFT between the output voltage terminal of the present stage and the supply voltage terminal, the eighth odd TFT switched according to the voltage of the QB-o node; and an eighth even TFT between the output voltage terminal of the present stage and the supply voltage terminal, the eighth even TFT switched according to the voltage of the QB-e node.

In another aspect, a shift register of a driving circuit for a flat panel display device having a plurality of stages includes: a first TFT receiving an output voltage of a previous stage and connected to a Q node, the first TFT having a diode structure such that a gate electrode is connected to a drain electrode; a second TFT between the Q node and a supply voltage terminal, the second TFT switched according to an output voltage of a next stage; a third odd-first TFT between an odd source voltage terminal and a QB-o node, the third odd-first TFT having a diode structure such that a gate electrode is connected to a drain electrode; a third odd-second TFT between the odd source voltage terminal and the QB-o node, the third odd-second TFT switched according to a voltage of a first node; a third odd-third TFT between the first node and the supply voltage terminal, the third odd-third TFT switched according to a voltage of the Q node; a third odd-fourth TFT between the first node and the supply voltage terminal, the third odd-fourth TFT switched according to the output voltage of the previous stage; a third even-first TFT between an even source voltage terminal and a QB-e node, the third even-first TFT having a diode structure such that a gate electrode is connected to a drain electrode; a third even-second TFT between the even source voltage terminal and the QB-e node, the third even-second TFT switched according to a voltage of a second node; a third even-third TFT between the second node and the supply voltage terminal, the third even-third TFT switched according to a voltage of the Q node; a third even-fourth TFT between the second node and the supply voltage terminal, the third even-fourth TFT switched according to the output voltage of the previous stage; a fourth TFT between a first clock terminal and an output voltage terminal of a present stage, the fourth TFT switched according to a voltage of the Q node; a fifth odd TFT between the QB-o node and the supply voltage terminal, the fifth odd TFT switched according to the voltage of the Q node; a fifth even TFT between the QB-e node and the supply voltage terminal, the fifth even TFT switched according to the voltage of the Q node; a sixth odd TFT between the QB-o node and the supply voltage terminal, the sixth odd TFT switched according to the output voltage of the previous stage; a sixth even TFT between the QB-e node and the supply voltage terminal, the sixth even TFT switched according to the output voltage of the previous stage; a seventh odd TFT between the Q node and the supply voltage terminal, the seventh odd TFT switched according to a voltage of the QB-o node; a seventh even TFT between the Q node and the supply voltage terminal, the seventh even TFT switched according to a voltage of the QB-e node; an eighth odd TFT between the output voltage terminal of the present stage and the supply voltage terminal, the eighth odd TFT switched according to the voltage of the QB-o node; and an eighth even TFT between the output voltage terminal of the present stage and the supply voltage terminal, the eighth even TFT switched according to the voltage of the QB-e node.

In another aspect, a shift register of a driving circuit for a flat panel display device having a plurality of stages includes: a first TFT receiving an output voltage of a previous stage and connected to a Q node, the first TFT having a diode structure such that a gate electrode is connected to a drain electrode; a second TFT between the Q node and a supply voltage terminal, the second TFT switched according to an output voltage of a next stage; a third odd-first TFT between an odd source voltage terminal and a QB-o node, the third odd-first TFT having a diode structure such that a gate electrode is connected to a drain electrode; a third odd-second TFT between the odd source voltage terminal and the QB-o node, the third odd-second TFT switched according to a voltage of a first node; a third odd-third TFT between the first node and the supply voltage terminal, the third odd-third TFT switched according to a voltage of the Q node; a third odd-fourth TFT between the first node and the supply voltage terminal, the third odd-fourth TFT switched according to the even source voltage; a third even-first TFT between an even source voltage terminal and a QB-e node, the third even-first TFT having a diode structure such that a gate electrode is connected to a drain electrode; a third even-second TFT between the even source voltage terminal and the QB-e node, the third even-second TFT switched according to a voltage of a second node; a third even-third TFT between the second node and the supply voltage terminal, the third even-third TFT switched according to a voltage of the Q node; a third even-fourth TFT between the second node and the supply voltage terminal, the third even-fourth TFT switched according to the odd source voltage; a fourth TFT between a first clock terminal and an output voltage terminal of a present stage, the fourth TFT switched according to a voltage of the Q node; a fifth odd TFT between the QB-o node and the supply voltage terminal, the fifth odd TFT switched according to the voltage of the Q node; a fifth even TFT between the QB-e node and the supply voltage terminal, the fifth even TFT switched according to the voltage of the Q node; a sixth odd TFT between the QB-o node and the supply voltage terminal, the sixth odd TFT switched according to the output voltage of the previous stage; a sixth even TFT between the QB-e node and the supply voltage terminal, the sixth even TFT switched according to the output voltage of the previous stage; a seventh odd TFT between the Q node and the supply voltage terminal, the seventh odd TFT switched according to a voltage of the QB-o node; a seventh even TFT between the Q node and the supply voltage terminal, the seventh even TFT switched according to a voltage of the QB-e node; an eighth odd TFT between the output voltage terminal of the present stage and the supply voltage terminal, the eighth odd TFT switched according to the voltage of the QB-o node; and an eighth even TFT between the output voltage terminal of the present stage and the supply voltage terminal, the eighth even TFT switched according to the voltage of the QB-e node.

In another aspect, a plurality of shift register stages of a driving circuit for a flat panel display device include: a first TFT charging a Q node according to a start signal; a second TFT discharging the Q node according to an output voltage of a next shift register stage; a pull-up unit increasing an output voltage of a present shift register stage according to a voltage of the Q node; an odd pull-down unit decreasing the output voltage of the present stage in an odd frame according to a voltage of a QB-o node; an even pull-down unit decreasing the output voltage of the present stage in an even frame according to a voltage of a QB-e node; a third odd TFT connected to the QB-o node, a gate electrode and a drain electrode of the third odd TFT connected to each other and receiving an odd source voltage; and a third even TFT connected to the QB-e node, a gate electrode and a drain electrode of the third even TFT connected to each other and receiving an even source voltage.

In yet another aspect, a shift register stage of a driving circuit for a flat panel display device, comprises: a first TFT having a gate and drain electrode both connected to a start signal terminal; a second TFT having a gate and drain electrode both connected to an odd source voltage terminal; a third TFT having a gate and drain electrode both connected to an even source voltage terminal; a fourth TFT connected between a clock terminal and an output node of the shift register stage, a source of the first TFT connected to a gate of the fourth TFT.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, an example of which is illustrated in the accompanying drawings.

To improve the reliability of a shift register including one pull-down unit, a shift register including two pull-down units is suggested, where the variation in characteristics of TFTs such as the threshold voltage shift is be reduced.

Figure 6:
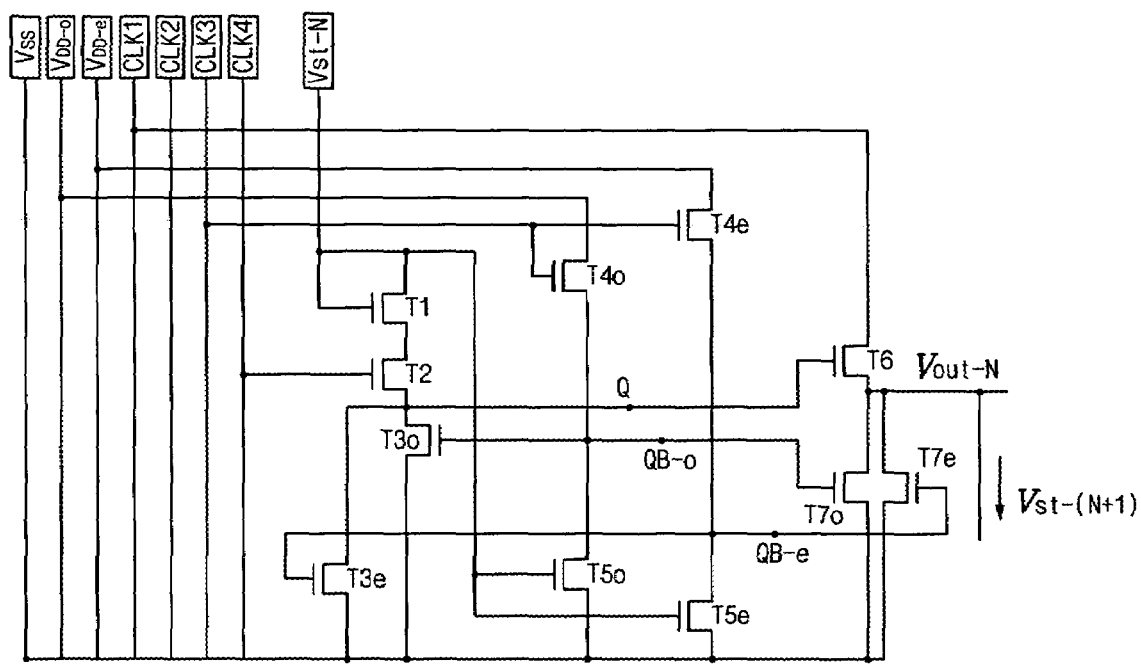
FIG. 6 is a schematic circuit diagram showing an $N^{th}$ stage of a shift register for a liquid crystal display device according to an embodiment of the present invention.
Figure 7:
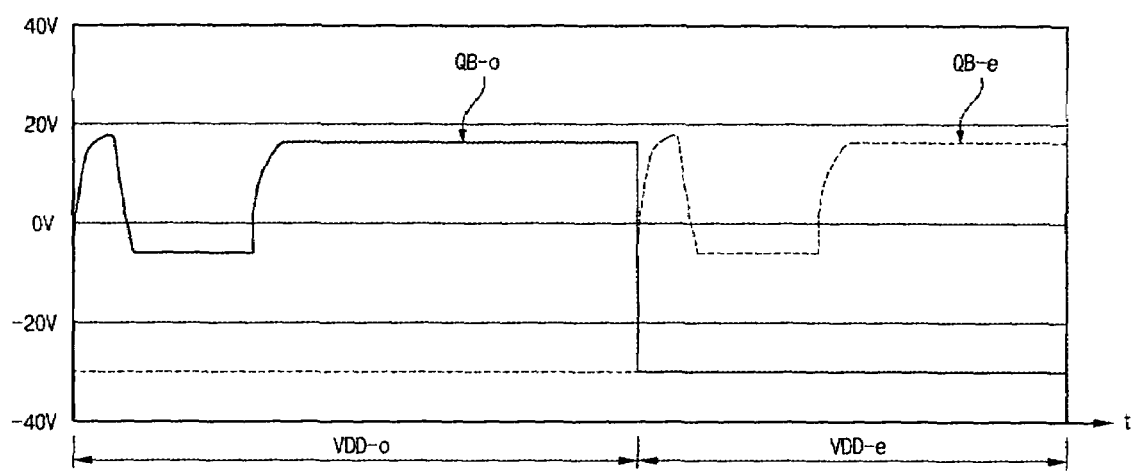
FIG. 7 is a schematic timing chart showing signals for driving a shift register of FIG. 6.

FIG. 6 is a schematic circuit diagram showing an $N^{th}$ stage of a shift register including two pull-down units for a liquid crystal display device according to an embodiment of the present invention and FIG. 7 is a schematic timing chart showing signals for driving a shift register of FIG. 6.

In FIGS. 6 and 7, an $N^{th}$ stage of a shift register includes a first thin film transistor (TFT) "T1," a second TFT "T2," a third odd TFT "T3o," a third even TFT "T3e," a fourth odd TFT "T4o," a fourth even TFT "T4e," a fifth odd TFT "T5o," a fifth even TFT "T5e," a sixth TFT "T6," a seventh even TFT "T7e," and a seventh odd TFT "T7o." In addition, a Q node is formed at a gate electrode of the sixth TFT "T6," while a QB-o node is formed at gate electrodes of the third odd TFT "T3o" and the seventh odd TFT "T7o" and a QB-e node is formed at gate electrodes of the third even TFT "T3e" and the seventh even TFT "T7e."

Figure 1:
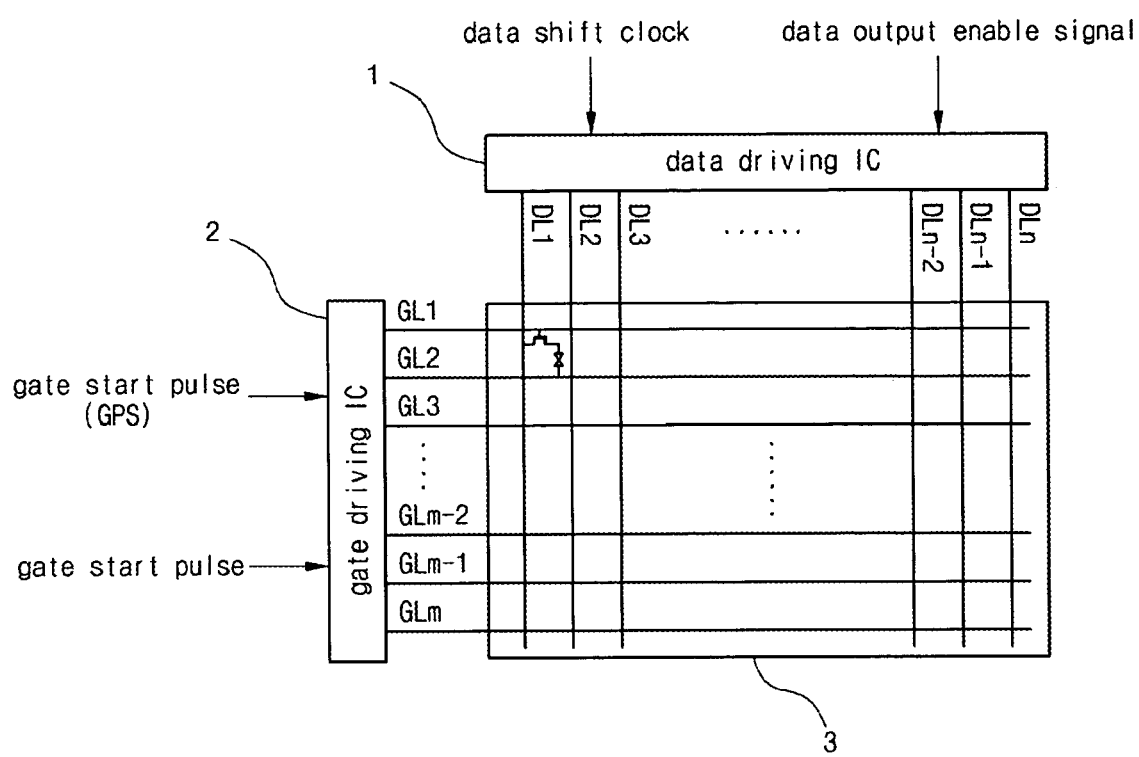
FIG. 1 is a schematic plan view showing an active matrix type liquid crystal display device according to the related art.
Figure 2:
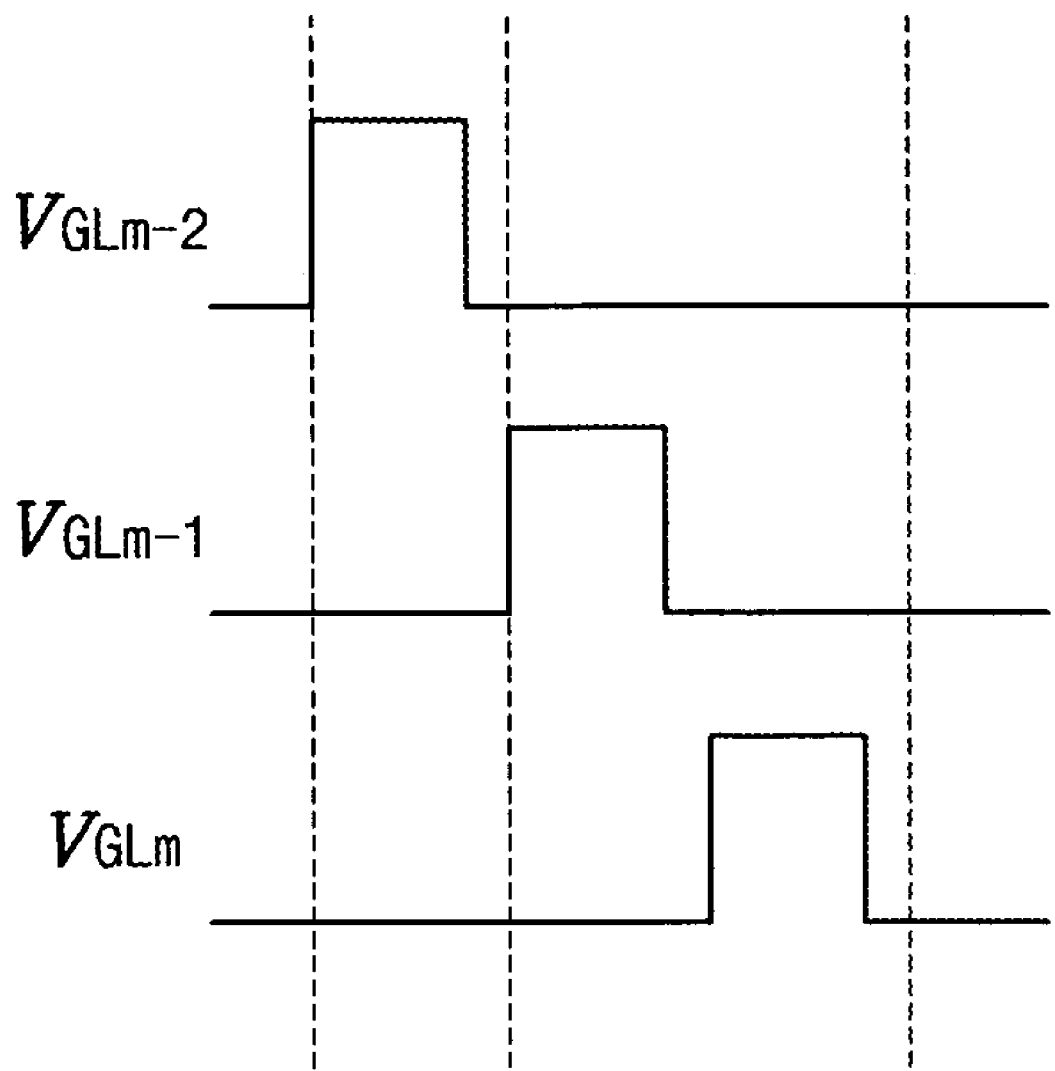
FIG. 2 is a schematic timing chart showing gate signals for an active matrix type liquid crystal display device according to the related art.
Figure 3:
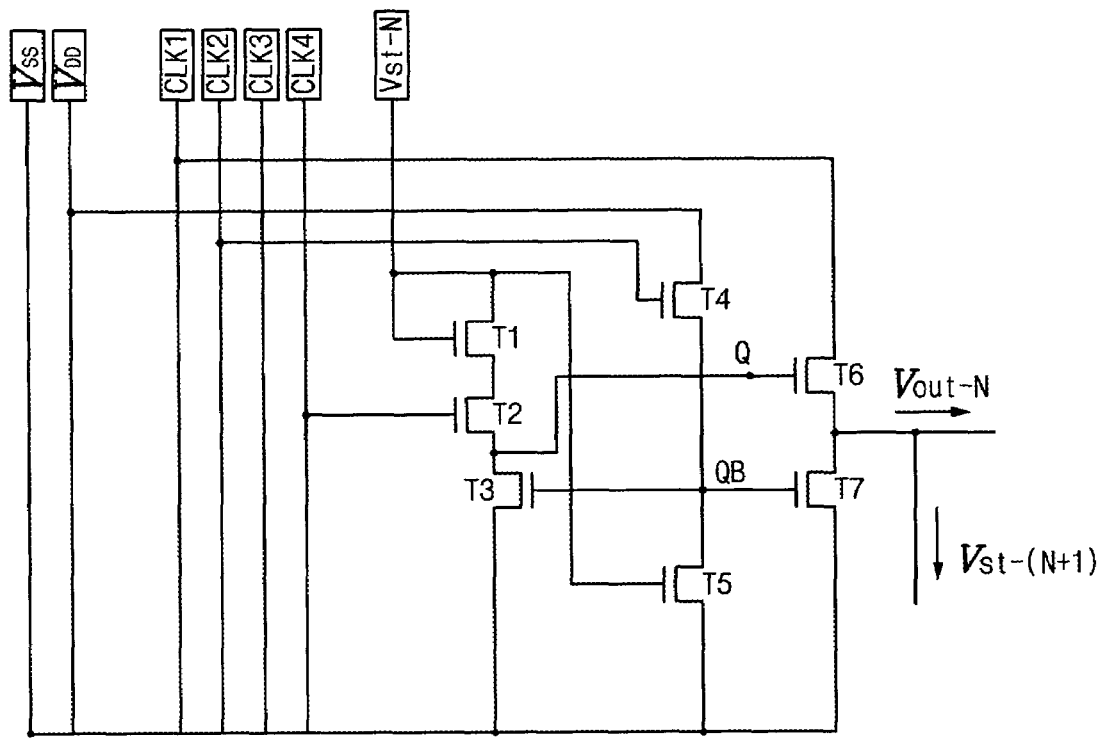
FIG. 3 is a schematic circuit diagram showing an $N^{th}$ stage of a shift register for a liquid crystal display device according to the related art.
Figure 4:
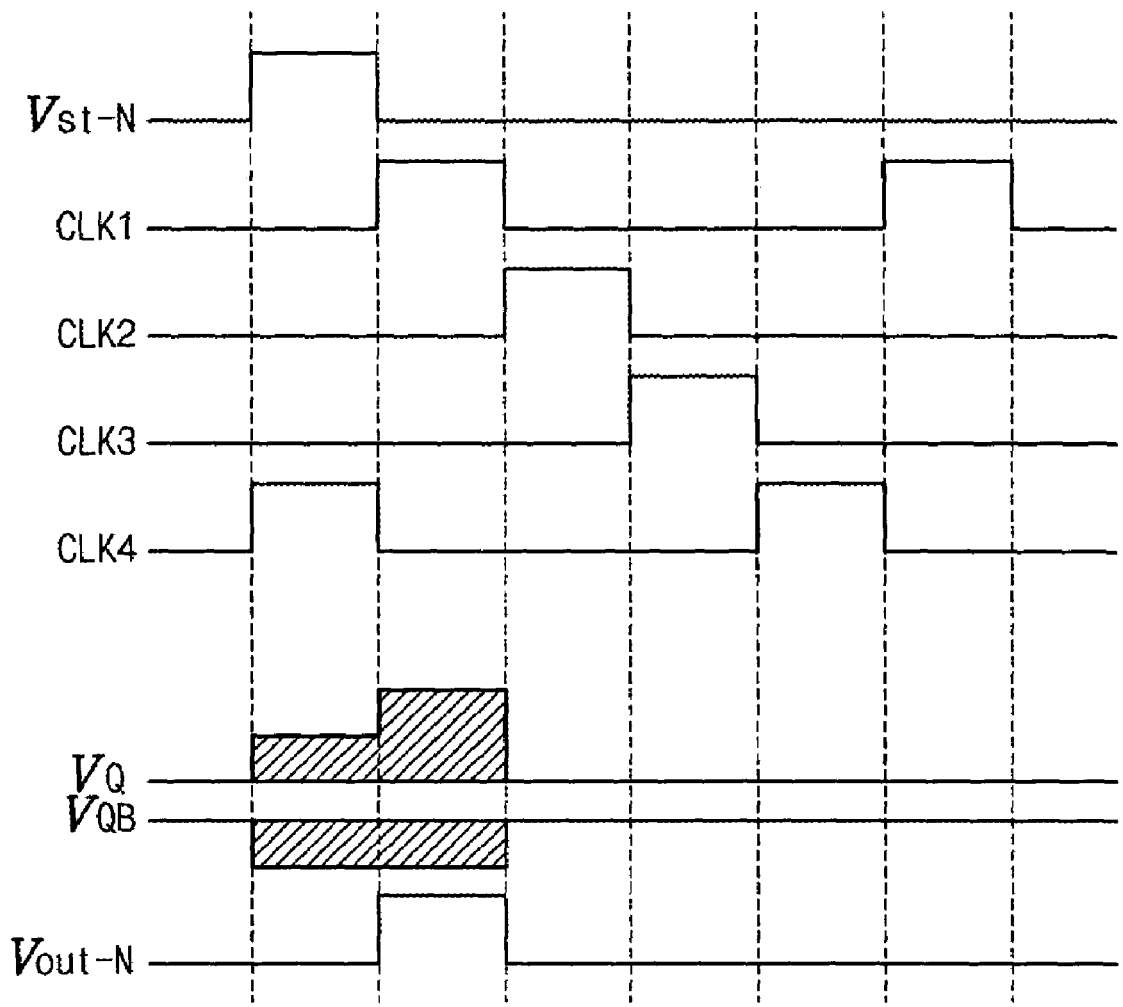
FIG. 4 is a schematic timing chart showing signals for driving a shift register of FIG. 3.
Figure 5:
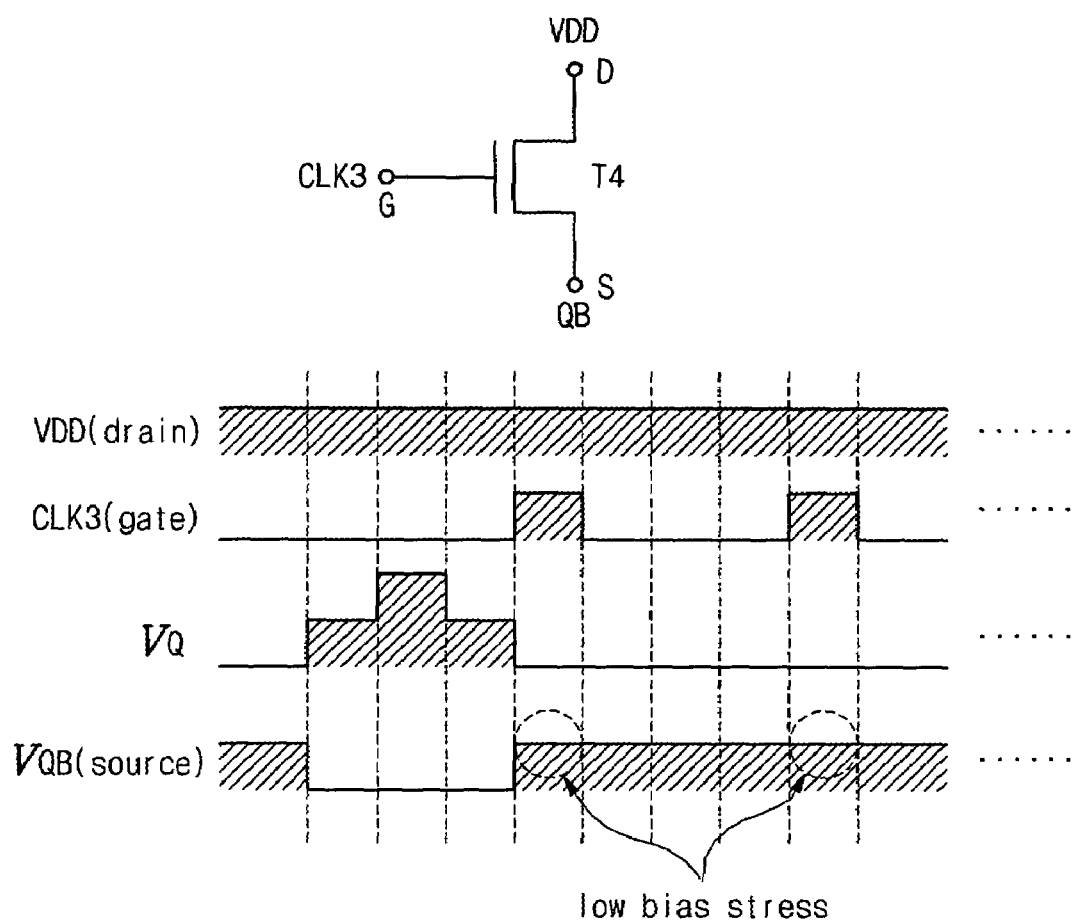
FIG. 5 is a view showing a fourth thin film transistor and signals of a shift register including one pull-down unit according to the related art.

First to fourth clocks "CLK1" to "CLK4" and a start signal "Vst-N" are input to the $N^{th}$ stage. Amorphous silicon (a-Si) thin film transistors (TFTs) are used as each of the TFTs. In addition, the $N^{th}$ stage of a shift register includes an odd pull-down unit including the third odd TFT "T3o" and the seventh odd TFT "T7o" and an even pull-down unit including the third even TFT "T3e" and the seventh even TFT "T7e." Accordingly, an odd source voltage "VDD-o" and an even source voltage "VDD-e" alternately having a high level voltage by frames are used for the odd and even pull-down units. For example, the odd source voltage "VDD-o" has a high level voltage during an odd frame and the even source voltage "VDD-e" has a high level voltage during an even frame. The first to fourth clocks "CLK1" to "CLK4" and a start signal "Vst-N" have the same shape as those of FIG. 4.

The start signal "Vst-N" and the fourth clock "CLK4" are input to the first TFT "T1," and the second TFT "T2," respectively. An output signal of an $(N-1)^{th}$ stage of the shift register (not shown) is used as the start signal "Vst-N" for the $N^{th}$ stage. While high level voltages of the start signal "Vst-N" and the fourth clock "CLK4" are applied to the first TFT "T1" and the second TFT "T2," the first TFT "T1" and the second TFT "t2" are turned on and the Q node is charged up according to the start signal "Vst-N." As a result, the high level voltage of the start signal "Vst-N" bootstraps the Q node. The start signal "Vst-N" and the fourth clock "CLK4" synchronize with each other. Accordingly, while a high level voltage of the first clock "CLK1" is input to the sixth TFT "T6," the Q node has a high level voltage to turn on the sixth TFT "T6" and the high level voltage of the first clock "CLK1" is output as an output signal "Vout-N" of the $N^{th}$ stage. The output signal "Vout-N" of the $N^{th}$ stage is used as a start signal "Vst-(N+1)" for an $(N+1)^{th}$ stage (not shown).

Next, while a high level voltage of the third clock "CLK3" is input to the fourth odd and even TFTs "T4o" and "T4e," the fourth odd and even TFTs "T4o" and "T4e" are turned on and the odd and even source voltages "VDD-o" and "VDD-e" are applied to the QB-o and QB-e nodes, respectively. Since the odd and even source voltages "VDD-o" and "VDD-e" alternately have a high level voltage by frames, the third odd and even TFTs "T3o" and "T3e" are alternately turned on. As a result, the Q node is discharged through the third odd TFT "T3o" during an odd frame and through the third even TFT "T3e" during an even frame.

Therefore, the third odd TFT "T3o" and the seventh odd TFT "T7o" are stressed alternately by a high level voltage bias during an odd frame and by a low level voltage bias during an even frame. In addition, the third even TFT "T3e" and the seventh even TFT "T7e" are stressed alternately by a low level voltage bias during an odd frame and by a high level voltage bias during an even frame. Accordingly, stresses due to the high level voltage bias on the TFTs of the odd and even pull-down units are compensated by the low level voltage bias.

However, even though the stresses on the TFTs of the odd and even pull-down units are compensated, the fourth odd TFT "T4o" and the fourth even TFT "T4e" are degraded by operation of the shift register for a long time period. For example, threshold voltages of the fourth odd TFT "T4o" and the fourth even TFT "T4e" are shifted and the threshold voltage shifts change effective voltages at the QB-o node and the QB-e node.

Figure 8:
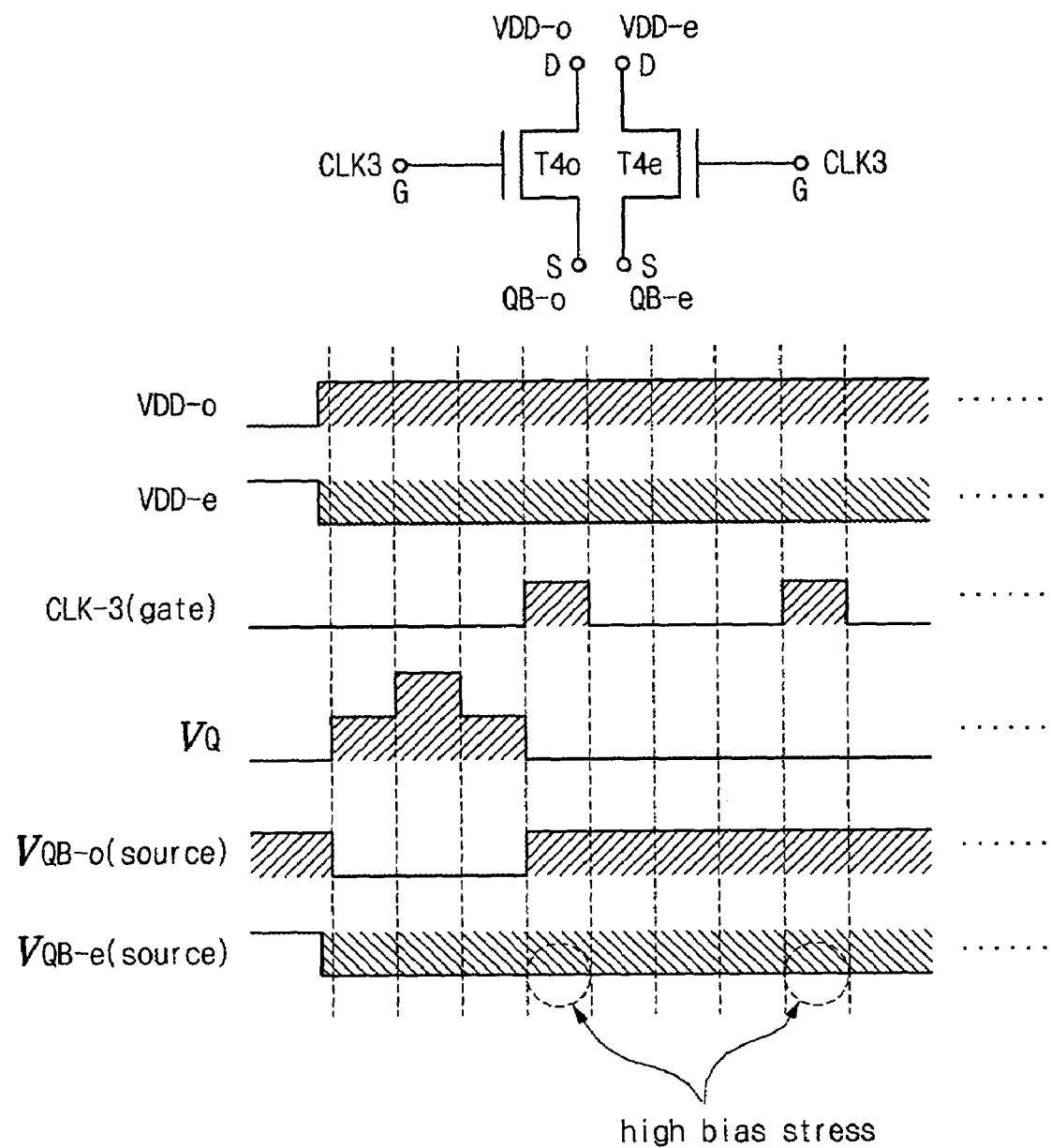
FIG. 8 is a view showing a fourth odd thin film transistor, a fourth even thin film transistor and signals of a shift register including two pull-down units according to an embodiment of the present invention.

FIG. 8 is a view showing a fourth odd thin film transistor, a fourth even thin film transistor and signals of a shift register including two pull-down units according to an embodiment of the present invention.

In FIG. 8, each of a fourth odd TFT "T4o" and a fourth even TFT "T4e" has a gate electrode "G," a source electrode "S" and a drain electrode "D." A third clock "CLK3" is applied to the gate electrodes of the fourth odd TFT "T4o" and the fourth even TFT "T4e." An odd source voltage "VDD-o" and an even source voltage "VDD-e" are applied to the drain electrodes of the fourth odd TFT "T4o" and the fourth even TFT "T4e," respectively. The odd source voltage "VDD-o" has a high level voltage during an odd frame and a low level voltage during an even frame. Contrarily, the even source voltage "VDD-e" has a low level voltage during an odd frame and a high level voltage during an even frame. During an odd frame, since the QB-e node voltage "VQB-e" and the even source voltage "VDD-e" has a low level voltage, the low level voltage is applied to the source electrode "S" and the drain electrode "D" of the fourth even TFT "T4e." Next, when a high level voltage of the third clock "CLK3" is applied to the gate electrode "G" of the fourth even TFT "T4e," voltage differences between the gate electrode "G" and the source electrode "S" and between the gate electrode "G" and the drain electrode "D" of the fourth even TFT "T4e" are maximized. Since stress due to the voltage differences is relatively high, this state may be referred to as a high bias stress condition and the stress causes variation in characteristics of fourth even TFT "T4e" such as a threshold voltage shift. Similarly, during an even frame, the fourth odd TFT "T4o" is in a high bias stress condition and characteristics of the fourth odd TFT "T4o" are varied.

To reduce the variation in characteristics of TFTs in a pull-up unit due to a high bias stress, a shift register including TFTs having a diode structure where a gate electrode and a drain electrode of the TFTs are connected to each other is suggested.

Figure 9:
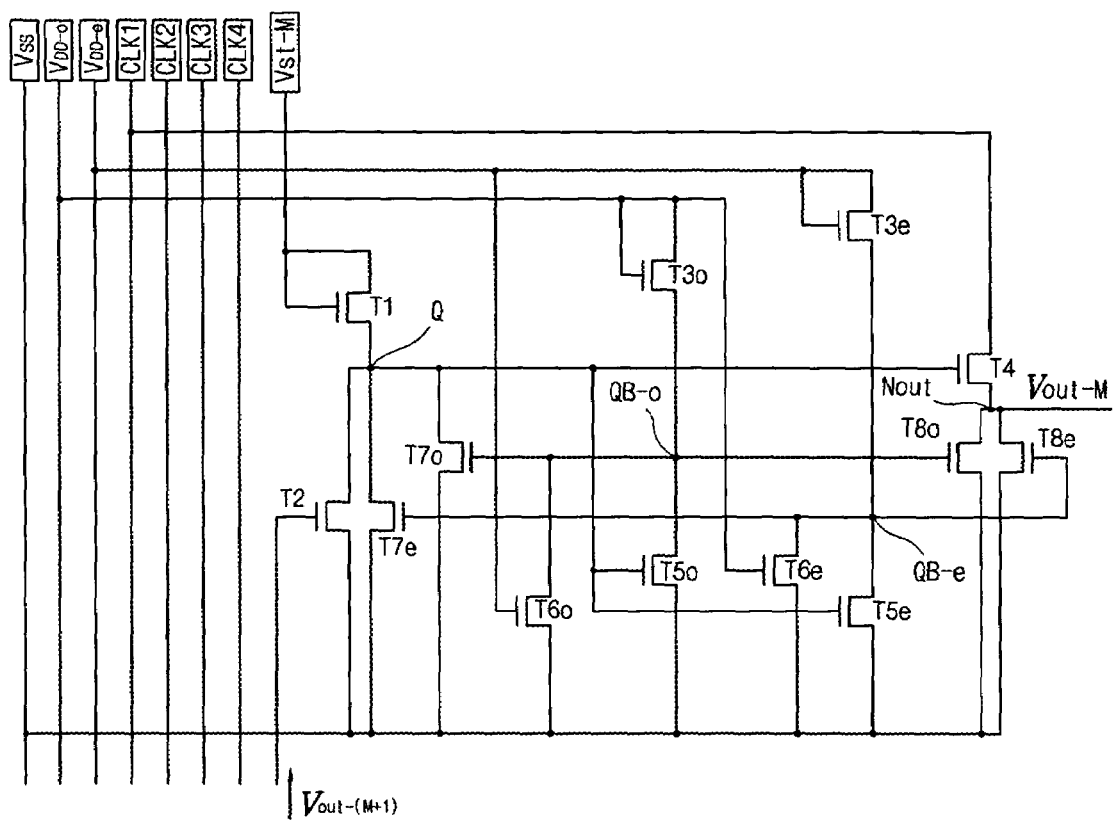
FIG. 9 is a schematic circuit diagram showing an $M^{th}$ stage of a shift register for a flat panel display device according to another embodiment of the present invention.

FIG. 9 is a schematic circuit diagram showing an $M^{th}$ stage of a shift register for a flat panel display device according to another embodiment of the present invention.

In FIG. 9, an $M^{th}$ stage of a shift register includes a first thin film transistor (TFT) "T1," a second TFT "T2," a third odd TFT "T3o," a third even TFT "T3e," a fourth TFT "T4," a fifth odd TFT "T5o," a fifth even TFT "T5e," a sixth odd TFT "T6o," a sixth even TFT "T6e," a seventh even TFT "T7e," a seventh odd TFT "T7o," and an eighth odd TFT "T8o," and an eighth even TFT "T8e." A Q node is disposed at a gate electrode of the fourth TFT "T4," while a QB-o node is disposed at gate electrodes of the seventh odd TFT "T7o" and the eighth odd TFT "T8o" and a QB-e node is disposed at gate electrodes of the seventh even TFT "T7e" and the eighth even TFT "T8e." An Nout node is disposed between the fourth TFT "T4" and the eighth odd TFT "T8o" and between the fourth TFT "T4" and the eighth even TFT "T8e."

First to fourth clocks "CLK1" to "CLK4" and a start signal "Vst-M" may be input to the $M^{th}$ stage. Amorphous silicon (a-Si) thin film transistors (TFTs) may be used as each of the TFTs. In addition, the $M^{th}$ stage of a shift register includes an odd pull-down unit having the seventh odd TFT "T7o" and the eighth odd TFT "T8o" and an even pull-down unit having the seventh even TFT "T7e" and the eighth even TFT "T8e." Accordingly, an odd source voltage "VDD-o" and an even source voltage "VDD-e" alternately having a high level voltage by frames are used for the odd and even pull-down units, respectively. For example, the odd source voltage "VDD-o" may have a high level voltage during an odd frame and the even source voltage "VDD-e" may have a high level voltage during an even frame. The first to fourth clocks "CLK1" to "CLK4" and a start signal "Vst-M" may have the same shape as those of FIG. 4.

The start signal "Vst-M" is input to the first TFT "T1." An output signal of an (M−1)$^{th}$ stage (not shown) of the shift register may be used as the start signal "Vst-M" for the M$^{th}$ stage. While a high level voltage of the start signal "Vst-M" is applied to the first TFT "T1," the first TFT "T1" is turned on and the Q node is charged up according to the start signal "Vst-M." As a result, the high level voltage of the start signal "Vst-M" bootstraps the Q node and the gate electrode of the fourth TFT "T4." Accordingly, while the high level voltage of the first clock "CLK1" is input to the fourth TFT "T4," the Q node has a high level voltage to turn on the fourth TFT "T4" and the high level voltage of the first clock "CLK1" is output as an output signal "Vout-M" of the M$^{th}$ stage. The output signal "Vout-M" of the M$^{th}$ stage may be used as a start signal "Vst-(M+1)" for an (M+1)$^{th}$ stage (not shown). The fourth TFT "T4" may function as a pull-up unit outputting a high level voltage.

An output signal "Vout-(M+1)" of an (M+1)$^{th}$ stage (not shown) of the shift register is input to the second TFT "T2" to discharge the Q node after the first clock "CLK1." The odd source voltage "VDD-o" and the even source voltage "VDD-e" are input to the third odd TFT "T3o" and the third even TFT "T3e," respectively. Each of the third odd TFT "T3o" and the third even TFT "T3e" has a diode structure such that a gate electrode is connected to a drain electrode. Accordingly, during an odd frame, the high level voltage of the odd source voltage "VDD-o" is applied to the gate electrode and the drain electrode of the third odd TFT "T3o" and the low level voltage of the even source voltage "VDD-e" is applied to the gate electrode and the drain electrode of the third even TFT "T3e." In addition, during an even frame, the low level voltage of the odd source voltage "VDD-o" is applied to the gate electrode and the drain electrode of the third odd TFT "T3o" and the high level voltage of the even source voltage "VDD-e" is applied to the gate electrode and the drain electrode of the third even TFT "T3e."

During an odd frame, since the high level voltage of the odd source voltage "VDD-o" is applied to a gate electrode of the eighth odd TFT "T8o" through the QB-o node, the eighth odd TFT "T8o" is turned on and the Nout node is discharged. The QB-o node having the high level voltage of the odd source voltage "VDD-o" is discharged when the start signal "Vst-M," for example, the output signal "Vout-(M−1)" of an (M−1)$^{th}$ stage (not shown) of the shift register is input to the fifth odd TFT "T5o" through the first TFT "T1." Since the fifth odd TFT "T5o" is turned on by the start signal "Vst-M," the QB-o node is discharged. Since the high level voltage of the odd source voltage "VDD-o" is also applied to a gate electrode of the sixth even TFT "T6e," the sixth even TFT "T6e" is turned on and the QB-e node is discharged. Accordingly, the eighth even TFT "T8e" is turned off during an odd frame and a high bias stress condition is prevented.

During an even frame, since the high level voltage of the even source voltage "VDD-e" is applied to a gate electrode of the eighth even TFT "T8e" through the QB-e node, the eighth even TFT "T8e" is turned on and the Nout node is discharged. The QB-e node having the high level voltage of the even source voltage "VDD-e" is discharged when the start signal "Vst-M," for example, the output signal "Vout-(M−1)" of an (M−1)$^{th}$ stage (not shown) of the shift register is input to the fifth odd TFT "T5o" through the first TFT "T1." Since the fifth odd TFT "T5o" is turned on by the start signal "Vst-M," the QB-o node is discharged. Since the high level voltage of the even source voltage "VDD-e" is also applied to a gate electrode of the sixth odd TFT "T6o," the sixth odd TFT "T6o" is turned on and the QB-o node is discharged. Accordingly, the eighth odd TFT "T8o" is turned off during an even frame and a high bias stress condition is prevented. In an operation of the shift register, since the odd pull-down unit including the seventh odd TFT "T7o" and the eighth odd TFT "T8o" and the even pull-down unit including the seventh even TFT "T7e" and the eighth even TFT "T8e" are alternately operated by frames, stress on the odd and even pull-down units due to a high level voltage is released by a low level voltage.

As referring again to an odd frame, a low level voltage of the even source voltage "VDD-e" is applied to the gate electrode and the drain electrode of the third even TFT "T3e." Moreover, since the QB-e node is discharged by the sixth even TFT "T6e" that is turned on by a high level voltage of the odd source voltage "VDD-o," the QB-e node has a low level voltage and the low level voltage of the QB-e node is applied to a source electrode of the third even TFT "T3e." As a result, the low level voltage is applied to the gate electrode, the drain electrode and the source electrode of the third even TFT "T3e" during an odd frame. Similarly, the low level voltage is applied to the gate electrode, the drain electrode and the source electrode of the third odd TFT "T3o" during an even frame. Since only the low level voltage is applied to the third odd TFT "T3o" during an even frame and to the third even TFT "T3e" during an odd frame, stress on the third odd TFT "T3o" and the third even TFT "T3e" due to a high level voltage is released by the low level voltage. Consequently, the stability and lifetime of the shift register are improved.

Figure 10:
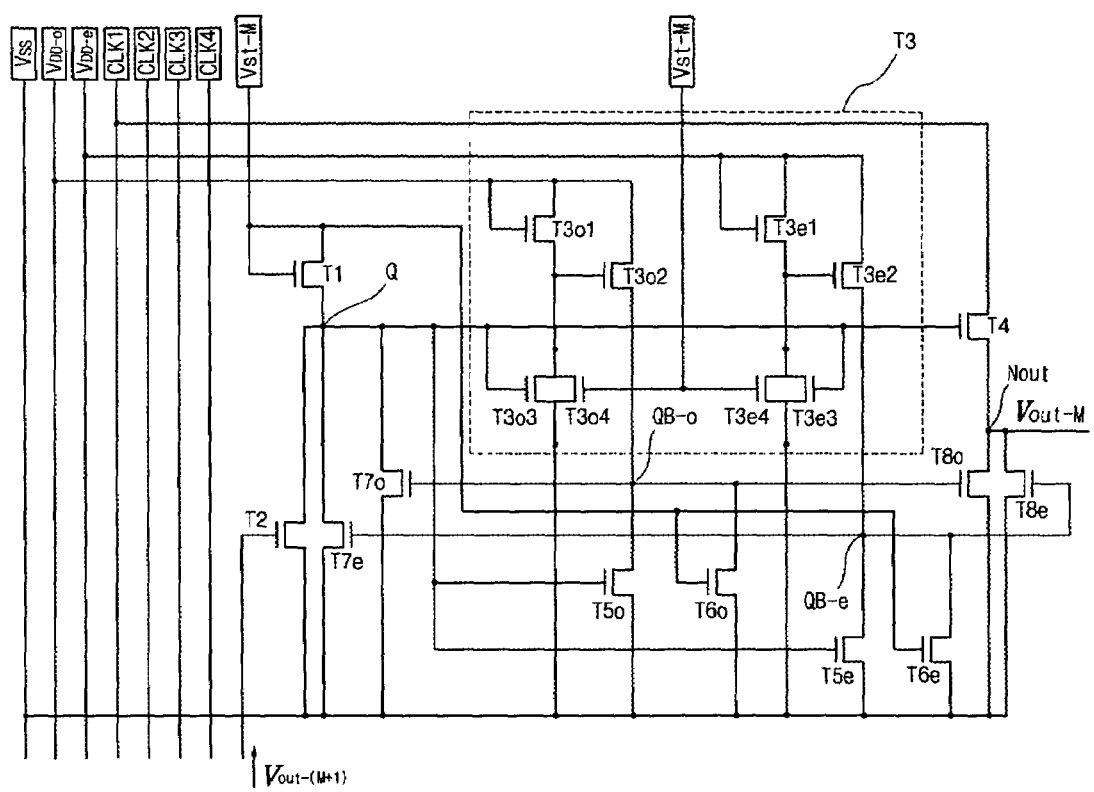
FIG. 10 is a schematic circuit diagram showing an $M^{th}$ stage of a shift register for a flat panel display device according to another embodiment of the present invention.

FIG. 10 is a schematic circuit diagram showing an M$^{th}$ stage of a shift register for a flat panel display device according to another embodiment of the present invention.

In FIG. 10, an M$^{th}$ stage of a shift register includes a first thin film transistor (TFT) "T1," a second TFT "T2," third TFTs, a fourth TFT "T4," a fifth odd TFT "T5o," a fifth even TFT "T5e," a sixth odd TFT "T6o," a sixth even TFT "T6e," a seventh even TFT "T7e," a seventh odd TFT "T7o," and an eighth odd TFT "T8o," and an eighth even TFT "T8e." The third TFTs may include a third odd-first TFT "T3o1" to a third odd-fourth TFT "T3o4" and a third even-first "T3e1" to a third even-fourth TFT "T3e4." A Q node is disposed at a gate electrode of the fourth TFT "T4," while a QB-o node is disposed at gate electrodes of the seventh odd TFT "T7o" and the eighth odd TFT "T8o" and a QB-e node is disposed at gate electrodes of the seventh even TFT "T7e" and the eighth even TFT "T8e." An Nout node is disposed between the fourth TFT "T4" and the eighth odd TFT "T8o" and between the fourth TFT "T4" and the eighth even TFT "T8e."

First to fourth clocks "CLK1" to "CLK4" and a start signal "Vst-M" may be used for the M$^{th}$ stage. Amorphous silicon (a-Si) thin film transistors (TFTs) may be used as each of the TFTs. In addition, the M$^{th}$ stage of a shift register includes an odd pull-down unit including the seventh odd TFT "T7o" and the eighth odd TFT "T8o" and an even pull-down unit including the seventh even TFT "T7e" and the eighth even TFT "T8e." Accordingly, an odd source voltage "VDD-o" and an even source voltage "VDD-e" alternately having a high level voltage by frames are used for the odd and even pull-down units, respectively. For example, the odd source voltage "VDD-o" may have a high level voltage during an odd frame and the even source voltage "VDD-e" may have a high level voltage during an even frame. The first to fourth clocks "CLK1" to "CLK4" and a start signal "Vst-M" may have the same shape as those of FIG. 4.

The start signal "Vst-M" is input to the first TFT "T1." An output signal of an $(M-1)^{th}$ stage (not shown) of the shift register may be used as the start signal "Vst-M" for the $M^{th}$ stage. While a high level voltage of the start signal "Vst-M" is applied to the first TFT "T1," the first TFT "T1" is turned on and the Q node is charged up according to the start signal "Vst-M." As a result, the high level voltage of the start signal "Vst-M" bootstraps the Q node and the gate electrode of the fourth TFT "T4." Accordingly, while the high level voltage of the first clock "CLK1" is input to the fourth TFT "T4," the Q node has a high level voltage to turn on the fourth TFT "T4" and the high level voltage of the first clock "CLK1" is output as an output signal "Vout-M" of the $M^{th}$ stage. The output signal "Vout-M" of the $M^{th}$ stage may be used as a start signal "Vst-(M+1)" for an $(M+1)^{th}$ stage (not shown).

An output signal "Vout-(M+1)" of an $(M+1)^{th}$ stage (not shown) of the shift register is input to the second TFT "T2" to discharge the Q node after the first clock "CLK1." The odd source voltage "VDD-o" and the even source voltage "VDD-e" are input to the third odd-first TFT "T3o1" and the third even-first TFT "T3e1," respectively. Each of the third odd-first TFT "T3o1" and the third even-first TFT "T3e1" has a diode structure such that a gate electrode is connected to a drain electrode. Accordingly, during an odd frame, the high level voltage of the odd source voltage "VDD-o" is applied to the gate electrode and the drain electrode of the third odd-first TFT "T3o1" and the low level voltage of the even source voltage "VDD-e" is applied to the gate electrode and the drain electrode of the third even-first TFT "T3e1." In addition, during an even frame, the low level voltage of the odd source voltage "VDD-o" is applied to the gate electrode and the drain electrode of the third odd-first TFT "T3o" and the high level voltage of the even source voltage "VDD-e" is applied to the gate electrode and the drain electrode of the third even-first TFT "T3e1."

The start signal "Vst-M" is also applied to gate electrodes of the third odd-fourth TFT "T3o4" and the third even-fourth TFT "T3e4" to turn on the third odd-fourth TFT "T3o4" and the third even-fourth TFT "T3e4." Accordingly, the gate electrodes of the third odd-second TFT "T3o2" and the third even-second TFT "T3e2" are discharged while the start signal "Vst-M" has a high level voltage. In addition, since the start signal "Vst-M" is also applied to gate electrodes of the third odd-third TFT "T3o3" and the third even-third TFT "T3e3" through the first TFT "T1," the third odd-third TFT "T3o3" and the third even-third TFT "T3e3" are turned on, and the gate electrodes of the third odd-second TFT "T3o2" and the third even-second TFT "T3e2" are further discharged while the start signal "Vst-M" has a high level voltage.

During an odd frame, the high level voltage of the odd source voltage "VDD-o" is applied to the gate electrode of the third odd-first TFT "T3o1" to turn on the third odd-first TFT "T3o1" and the high level voltage of the odd source voltage "VDD-o" is applied to a gate electrode of the third odd-second TFT "T3o2" to turn on the third odd-second TFT "T3o2." Accordingly, the QB-o node and a gate electrode of the eighth odd TFT "T8o" are charged up to the high level of the odd source voltage "VDD-o." As a result, the eighth odd TFT "T8o" is turned on and the Nout node is discharged. The QB-o node having the high level voltage of the odd source voltage "VDD-o" is discharged when the start signal "Vst-M" is input to the fifth odd TFT "T5o." Since the high level voltage of the start signal "Vst-M" is applied to a gate electrode of the sixth even TFT "T6e" to turn on the sixth even TFT "T6e," the QB-e node is discharged. At the same time, the low level voltage of the even source voltage "VDD-e" is applied to a gate electrode of the third even-first TFT "T3e1" to turn off the third even-first TFT "T3a1" and the third even-second TFT "T3e2." Accordingly, the QB-e node is not charged up and the eighth even TFT "T8e" is turned off during an odd frame. As a result, a high bias stress condition is prevented in the eighth even TFT "T8e" during an odd frame.

During an even frame, since the high level voltage of the even source voltage "VDD-e" is applied to a gate electrode of the third even-first TFT "T3e1" to turn on the third even-first TFT "T3e1," thereby applying the high level voltage of the even source voltage "VDD-e" to a gate electrode of the third even-second TFT "T3e2" to turn on the third even-second TFT "T3e2." Accordingly, the QB-e node is charged up to the high level voltage of the even source voltage "VDD-e" and the eighth even TFT "T8e" is turned on, thereby discharging the Nout node. The QB-e node having the high level voltage of the even source voltage "VDD-e" is discharged when the start signal "Vst-M" is input to the fifth even TFT "T5e." Since the high level voltage of the start signal "Vst-M" is applied to a gate electrode of the sixth odd TFT "T6o" to turn on the sixth odd TFT "T6o," the QB-o node is discharged. At the same time, the low level voltage of the odd source voltage "VDD-o" is applied to a gate electrode of the third odd-first TFT "T3o1" to turn off the third odd-first TFT "T3o1" and the third odd-second TFT "T3o2." Accordingly, the QB-o node is not charged up and the eighth odd TFT "T8o" is turned off during an even frame. As a result, a high bias stress condition is prevented in the eighth odd TFT "T8o" during an even frame.

In an operation of the shift register, since the odd pull-down unit including the seventh odd TFT "T7o" and the eighth odd TFT "T8o" and the even pull-down unit including the seventh even TFT "T7e" and the eighth even TFT "T8e" are alternately operated by frames, stress on the odd and even pull-down units due to a high level voltage is released by a low level voltage during an opposite frame.

As referring again to an odd frame, a low level voltage of the even source voltage "VDD-e" is applied to the gate electrode and the drain electrode of the third even-second TFT "T3e2" through the third even-first TFT "T3e1" turned on. Moreover, since the QB-e node is discharged by the sixth even TFT "T6e" that is turned on by a high level voltage of the start signal "Vst-M," the QB-e node has a low level voltage and the low level voltage of the QB-e node is applied to a source electrode of the third even-second TFT "T3e2." As a result, the low level voltage is applied to the gate electrode, the drain electrode and the source electrode of the third even-second TFT "T3e2" during an odd frame. Similarly, the low level voltage is applied to the gate electrode, the drain electrode and the source electrode of the third odd-second TFT "T3o2" during an even frame. Since only the low level voltage is applied to the third odd-second TFT "T3o2" during an even frame and to the third even-second TFT "T3e2" during an odd frame, stress on the third odd-second TFT "T3o2" and the third even-second TFT "T3e2" due to a high level voltage is released by the low level voltage. Consequently, the stability and lifetime of a shift register are improved.

Figure 11:
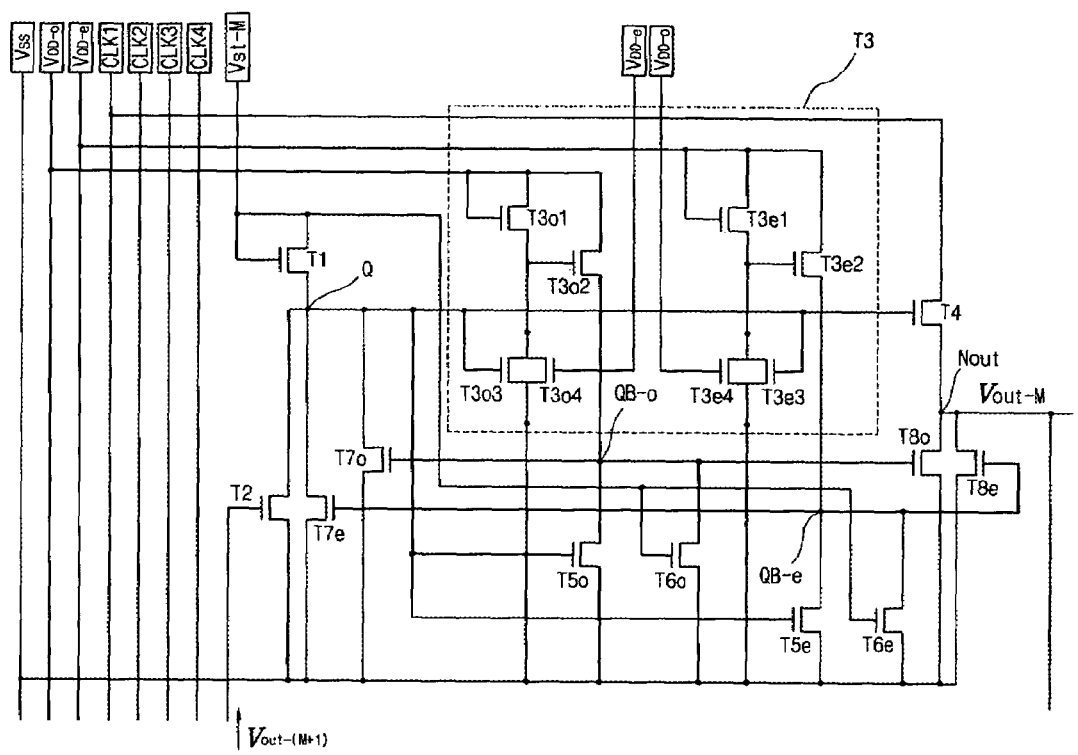
FIG. 11 is a schematic circuit diagram showing an $M^{th}$ stage of a shift register for a flat panel display device according to another embodiment of the present invention.

FIG. 11 is a schematic circuit diagram showing an $M^{th}$ stage of a shift register for a flat panel display device according to another embodiment of the present invention.

In FIG. 11, an $M^{th}$ stage of a shift register includes a first thin film transistor (TFT) "T1," a second TFT "T2," third TFTs, a fourth TFT "T4," a fifth odd TFT "T5o," a fifth even TFT "T5e," a sixth odd TFT "T6o," a sixth even TFT "T6e," a seventh even TFT "T7e," a seventh odd TFT "T7o," and an eighth odd TFT "T8o," and an eighth even TFT "T8e." The third TFTs may include a third odd-first TFT "T3o1" to a third odd-fourth TFT "T3o4" and a third even-first "T3e1" to a third even-fourth TFT "T3e4." A Q node is disposed at a gate electrode of the fourth TFT "T4," while a QB-o node is disposed at gate electrodes of the seventh odd TFT "T7o" and the eighth odd TFT "T8o" and a QB-e node is disposed at gate electrodes of the seventh even TFT "T7e" and the eighth even TFT "T8e." An Nout node is disposed between the fourth TFT "T4" and the eighth odd TFT "T8o" and between the fourth TFT "T4" and the eighth even TFT "T8e."

First to fourth clocks "CLK1" to "CLK4" and a start signal "Vst-M" may be used for the $M^{th}$ stage. Amorphous silicon (a-Si) thin film transistors (TFTs) of negative (N) type may be used as each of the TFTs. In addition, the $M^{th}$ stage of a shift register includes an odd pull-down unit including the seventh odd TFT "T7o" and the eighth odd TFT "T8o" and an even pull-down unit including the seventh even TFT "T7e" and the eighth even TFT "T8e." Accordingly, an odd source voltage "VDD-o" and an even source voltage "VDD-e" alternately having a high level voltage by frames are used for the odd and even pull-down units, respectively. For example, the odd source voltage "VDD-o" may have a high level voltage during an odd frame and the even source voltage "VDD-e" may have a high level voltage during an even frame. The first to fourth clocks "CLK1" to "CLK4" and a start signal "Vst-M" may have the same shape as those of FIG. 4.

The start signal "Vst-M" is input to the first TFT "T1." An output signal of an $(M-1)^{th}$ stage (not shown) of the shift register may be used as the start signal "Vst-M" for the $M^{th}$ stage. While a high level voltage of the start signal "Vst-M" is applied to the first TFT "T1," the first TFT "T1" is turned on and the Q node is charged up according to the start signal "Vst-M." As a result, the high level voltage of the start signal "Vst-M" bootstraps the Q node and the gate electrode of the fourth TFT "T4." Accordingly, while the high level voltage of the first clock "CLK1" is input to the fourth TFT "T4," the Q node has a high level voltage to turn on the fourth TFT "T4" and the high level voltage of the first clock "CLK1" is output as an output signal "Vout-M" of the $M^{th}$ stage. The output signal "Vout-M" of the $M^{th}$ stage may be used as a start signal "Vst-(M+1)" for an $(M+1)^{th}$ stage (not shown).

An output signal "Vout-(M+1)" of an $(M+1)^{th}$ stage (not shown) of the shift register is input to the second TFT "T2" to discharge the Q node after the first clock "CLK1." The odd source voltage "VDD-o" and the even source voltage "VDD-e" are input to the third odd-first TFT "T3o1" and the third even-first TFT "T3e1," respectively. Each of the third odd-first TFT "T3o1" and the third even-first TFT "T3e1" has a diode structure such that a gate electrode is connected to a drain electrode. Accordingly, during an odd frame, the high level voltage of the odd source voltage "VDD-o" is applied to the gate electrode and the drain electrode of the third odd-first TFT "T3o1" and the low level voltage of the even source voltage "VDD-e" is applied to the gate electrode and the drain electrode of the third even-first TFT "T3e1." In addition, during an even frame, the low level voltage of the odd source voltage "VDD-o" is applied to the gate electrode and the drain electrode of the third odd-first TFT "T3o1" and the high level voltage of the even source voltage "VDD-e" is applied to the gate electrode and the drain electrode of the third even-first TFT "T3e1."

Contrary to the $M^{th}$ stage of a shift register of FIG. 9, the even source voltage "VDD-e" is also applied to a gate electrode of the third odd-fourth TFT "T3o4" and the odd source voltage "VDD-o" is applied to a gate electrode of the third even-fourth TFT "T3e4." Accordingly, the gate electrode of the third even-second TFT "T3e2" is discharged through the third even-fourth TFT "T3e4" during an odd frame and the gate electrode of the third odd-second TFT "T3o2" is discharged through the third odd-fourth TFT "T3o4" during an even frame. As a result, the third even-second TFT "T3e2" is turned off during an odd frame and the third odd-second TFT "T3o2" is turned off during an even frame. In addition, since the start signal "Vst-M+1" is applied to gate electrodes of the third odd-third TFT "T3o3" and the third even-third TF1 "T3e3" through the first TFT "T1," the third odd-third TFT "T3o3" and the third even-third TFT "T3e3" are turned on, and the gate electrodes of the third odd-second TFT "T3o2" and the third even-second TFT "T3e2" are discharged while the output signal "Vout-(M+1)" of an $(M+1)^{th}$ stage (not shown) of the shift register has a high level voltage.

During an odd frame, the high level voltage of the odd source voltage "VDD-o" is applied to the gate electrode of the third odd-first TFT "T3o1" to turn on the third odd-first TFT "T3o1" and the high level voltage of the odd source voltage "VDD-o" is applied to a gate electrode of the third odd-second TFT "T3o2" to turn on the third odd-second TFT "T3o2." Accordingly, the QB-o node and a gate electrode of the eighth odd TFT "T8o" are charged up to the high level of the odd source voltage "VDD-o." As a result, the eighth odd TFT "T8o" is turned on and the Nout node is discharged. The QB-o node having the high level voltage of the odd source voltage "VDD-o" is discharged when the start signal "Vst-M" is input to the fifth odd TFT "T5o" through the first TFT "T1." Since the high level voltage of the start signal "Vst-M" is applied to a gate electrode of the sixth even TFT "T6e" to turn on the sixth even TFT "T6e," the QB-e node is discharged. At the same time, the low level voltage of the even source voltage "VDD-e" is applied to a gate electrode of the third even-first TFT "T3e1" to turn off the third even-first TFT "T3e1" and the third even-second TFT "T3e2." Accordingly, the QB-e node is not charged up and the eighth even TFT "T8e" is turned off during an odd frame. As a result, a high bias stress condition is prevented in the eighth even TFT "T8e" during an odd frame.

During an even frame, since the high level voltage of the even source voltage "VDD-e" is applied to a gate electrode of the third even-first TFT "T3e1" to turn on the third even-first TFT "T3e1," thereby applying the high level voltage of the even source voltage "VDD-e" to a gate electrode of the third even-second TFT "T3e2" to turn on the third even-second TFT "T3e2." Accordingly, the QB-e node is charged up to the high level voltage of the even source voltage "VDD-e" and the eighth even TFT "T8e" is turned on, thereby discharging the Nout node. The QB-e node having the high level voltage of the even source voltage "VDD-e" is discharged when the start signal "Vst-M" is input to the fifth even TFT "T5e" through the first TFT "T1." Since the high level voltage of the start signal "Vst-M" is applied to a gate electrode of the sixth odd TFT "T6o" to turn on the sixth odd TFT "T6o," the QB-o node is discharged. At the same time, the low level voltage of the odd source voltage "VDD-o" is applied to a gate electrode of the third odd-first TFT "T3o1" to turn off the third odd-first TFT "T3o1" and the third odd-second TFT "T3o2." Accordingly, the QB-o node is not charged up and the eighth odd TF1 "T8o" is turned off during an even frame. As a result, a high bias stress condition is prevented in the eighth odd TFT "T8o" during an even frame.

In an operation of the shift register, since the odd pull-down unit including the seventh odd TFT "T7o" and the eighth odd TFT "T8o" and the even pull-down unit including the seventh even TFT "T7e" and the eighth even TFT "T8e" are alternately operated by frames, stress on the odd and even pull-down units due to a high level voltage is released by a low level voltage during an opposite frame.

Referring again to an odd frame, a low level voltage of the even source voltage "VDD-e" is applied to the gate electrode and the drain electrode of the third even-second TFT "T3e2" through the third even-first TFT "T3e1" turned on. Moreover, since the QB-e node is discharged by the sixth even TFT "T6e" that is turned on by a high level voltage of the start signal "Vst-M," the QB-e node has a low level voltage and the low level voltage of the QB-e node is applied to a source electrode of the third even-second TFT "T3e2." As a result, the low level voltage is applied to the gate electrode, the drain electrode and the source electrode of the third even-second TFT "T3e2" during an odd frame. Similarly, the low level voltage is applied to the gate electrode, the drain electrode and the source electrode of the third odd-second TFT "T3o2" during an even frame. Since only the low level voltage is applied to the third odd-second TFT "T3o2" during an even frame and to the third even-second TFT "T3e2" during an odd frame, stress on the third odd-second TFT "T3o2" and the third even-second TFT "T3e2" due to a high level voltage is released by the low level voltage. Consequently, the stability and lifetime of a shift register are improved.

A shift register of the present invention includes an odd pull-down unit and an even pull-down unit alternately operated, and a reverse bias or a ground bias is applied to one of the odd pull-down unit and the even pull-down unit while the one of the odd pull-down unit and the even pull-down unit is not operated. Accordingly, stress on TFTs constituting the odd pull-down unit and the even pull-down unit is released. In addition, since a unit controlling the odd pull-down unit and the even pull-down unit is constituted by pair TFTs alternately operated, stress on the pair TFTs is also released. Therefore, the stability and lifetime of a shift register are improved.

It will be apparent to those skilled in the art that various modifications and variations can be made in a driving circuit including a shift register and a flat panel display device using the driving circuit of the present invention without departing from the spirit or scope of the invention. Thus, it is intended that the present invention cover the modifications and variations of this invention provided they come within the scope of the appended claims and their equivalents.

What is claimed is:

1. A shift register of a driving circuit for a flat panel display device having a plurality of stages, comprising:
   a first thin film transistor (TFT) receiving an output voltage of a previous stage and connected to a Q node, the first thin film transistor having a diode structure such that a gate electrode of the first TFT is connected to a drain electrode of the first TFT;
   a second TFT between the Q node and a supply voltage terminal, the second TFT switched according to an output voltage of a next stage;
   a third odd TFT between an odd source voltage terminal and a QB-o node, the third odd TFT having a diode structure such that a gate electrode of the third odd TFT is connected to a drain electrode of the third odd TFT;
   a third even TFT between an even source voltage terminal and a QB-e node, the third even TFT having a diode structure such that a gate electrode of the third even TFT is connected to a drain electrode of the third even TFT;
   a fourth TFT between a first clock terminal and an output voltage terminal of a present stage, the fourth TFT switched according to a voltage of the Q node;
   a fifth odd TFT between the QB-o node and the supply voltage terminal, the fifth odd TFT switched according to the voltage of the Q node;
   a fifth even TFT between the QB-e node and the supply voltage terminal, the fifth even TFT switched according to the voltage of the Q node;
   a sixth odd TFT between the QB-o node and the supply voltage terminal, wherein a pate electrode of the sixth odd TFT is connected to the even source voltage terminal such that the sixth odd TFT is switched according to an even source voltage of the even source voltage terminal;
   a sixth even TFT between the QB-e node and the supply voltage terminal, wherein a gate electrode of the sixth even TFT is connected to the odd source voltage terminal such that the sixth even TFT is switched according to an odd source voltage of the odd source voltage terminal, wherein each of the even source voltage and the odd source voltage alternately has a high level voltage by frames, and wherein the even source voltage has an opposite level voltage to the odd source voltage in each frame;
   a seventh odd TFT between the Q node and the supply voltage terminal, the seventh odd TFT switched according to a voltage of the QB-o node;
   a seventh even TFT between the Q node and the supply voltage terminal, the seventh even TFT switched according to a voltage of the QB-e node;
   an eighth odd TFT between the output voltage terminal of the present stage and the supply voltage terminal, the eighth odd TFT switched according to the voltage of the QB-o node; and
   an eighth even TFT between the output voltage terminal of the present stage and the supply voltage terminal, the eighth even TFT switched according to the voltage of the QB-e node.

2. The shift register according to claim 1, wherein the odd source voltage and the even source voltage include pulses having the same period and the opposite phase.

3. The shift register according to claim 2, wherein the period of the pulse is longer than a period of a single frame.

4. The shift register according to claim 1, wherein the first to eighth even TFTs include an n-type amorphous silicon TFT.

5. The shift register according to claim 1, wherein the output voltage of the previous stage for a first stage of the plurality of stages includes a start signal.

6. The shift register according to claim 1, wherein the supply voltage terminal has one of a ground voltage and a low level voltage.

7. A shift register of a driving circuit for a flat panel display device having a plurality of stages, comprising:
   a first thin film transistor (TFT) receiving an output voltage of a previous stage and connected to a Q node, the first TFT having a diode structure such that a gate electrode of the first TFT is connected to a drain electrode of the first TFT;
   a second TFT between the Q node and a supply voltage terminal, the second TFT switched according to an output voltage of a next stage;
   a third odd-first TFT between an odd source voltage terminal and a QB-o node, the third odd-first TFT having a diode structure such that a gate electrode of the third odd-first TFT is connected to a drain electrode of the third odd-first TFT;

a third odd-second TFT between the odd source voltage terminal and the QB-o node, the third odd-second TFT switched according to a voltage of a first node;

a third odd-third TFT between the first node and the supply voltage terminal, the third odd-third TFT switched according to a voltage of the Q node;

a third odd-fourth TFT between the first node and the supply voltage terminal, the third odd-fourth TFT switched according to the output voltage of the previous stage;

a third even-first TFT between an even source voltage terminal and a QB-e node, the third even-first TFT having a diode structure such that a gate electrode of the third even-first TFT is connected to a drain electrode of the third even-first TFT;

a third even-second TFT between the even source voltage terminal and the QB-e node, the third even-second TFT switched according to a voltage of a second node;

a third even-third TFT between the second node and the supply voltage terminal, the third even-third TFT switched according to a voltage of the Q node;

a third even-fourth TFT between the second node and the supply voltage terminal, the third even-fourth TFT switched according to the output voltage of the previous stage;

a fourth TFT between a first clock terminal and an output voltage terminal of a present stage, the fourth TFT switched according to a voltage of the Q node;

a fifth odd TFT between the QB-o node and the supply voltage terminal, the fifth odd TFT switched according to the voltage of the Q node;

a fifth even TFT between the QB-e node and the supply voltage terminal, the fifth even TFT switched according to the voltage of the Q node;

a sixth odd TFT between the QB-o node and the supply voltage terminal, the sixth odd TFT switched according to the output voltage of the previous stage;

a sixth even TFT between the QB-e node and the supply voltage terminal, the sixth even TFT switched according to the output voltage of the previous stage;

a seventh odd TFT between the Q node and the supply voltage terminal, the seventh odd TFT switched according to a voltage of the QB-o node;

a seventh even TFT between the Q node and the supply voltage terminal, the seventh even TFT switched according to a voltage of the QB-e node;

an eighth odd TFT between the output voltage terminal of the present stage and the supply voltage terminal, the eighth odd TFT switched according to the voltage of the QB-o node; and an eighth even TFT between the output voltage terminal of the present stage and the supply voltage terminal, the eighth even TFT switched according to the voltage of the QB-e node.

8. The shift register according to claim 7, wherein the odd source voltage and the even source voltage include pulses having the same period and the opposite phase.

9. The shift register according to claim 8, wherein the period of the pulse is longer than a period of a single frame.

10. The shift register according to claim 7, wherein the first to eighth even TFTs include an n-type amorphous silicon TFT.

11. The shift register according to claim 7, wherein the output voltage of the previous stage for a first stage of the plurality of stages includes a start signal.

12. The shift register according to claim 7, wherein the supply voltage terminal has one of a ground voltage and a low level voltage.

13. A shift register of a driving circuit for a flat panel display device having a plurality of stages, comprising:

a first thin film transistor (TFT) receiving an output voltage of a previous stage and connected to a Q node, the first TFT having a diode structure such that a gate electrode of the first TFT is connected to a drain electrode of the first TFT;

a second TFT between the Q node and a supply voltage terminal, the second TFT switched according to an output voltage of a next stage;

a third odd-first TFT between an odd source voltage terminal and a QB-o node, the third odd-first TFT having a diode structure such that a gate electrode of the third odd-first TFT is connected to a drain electrode of the third odd-first TFT;

a third odd-second TFT between the odd source voltage terminal and the QB-o node, the third odd-second TFT switched according to a voltage of a first node;

a third odd-third TFT between the first node and the supply voltage terminal, the third odd-third TFT switched according to a voltage of the Q node;

a third odd-fourth TFT between the first node and the supply voltage terminal, the third odd-fourth TFT switched according to the even source voltage;

a third even-first TFT between an even source voltage terminal and a QB-e node, the third even-first TFT having a diode structure such that a gate electrode of the third even-first TFT is connected to a drain electrode of the third even-first TFT;

a third even-second TFT between the even source voltage terminal and the QB-e node, the third even-second TFT switched according to a voltage of a second node;

a third even-third TFT between the second node and the supply voltage terminal, the third even-third TFT switched according to a voltage of the Q node;

a third even-fourth TFT between the second node and the supply voltage terminal, the third even-fourth TFT switched according to the odd source voltage;

a fourth TFT between a first clock terminal and an output voltage terminal of a present stage, the fourth TFT switched according to a voltage of the Q node;

a fifth odd TFT between the QB-o node and the supply voltage terminal, the fifth odd TFT switched according to the voltage of the Q node;

a fifth even TFT between the QB-e node and the supply voltage terminal, the fifth even TFT switched according to the voltage of the Q node;

a sixth odd TFT between the QB-o node and the supply voltage terminal, the sixth odd TFT switched according to the output voltage of the previous stage;

a sixth even TFT between the QB-e node and the supply voltage terminal, the sixth even TFT switched according to the output voltage of the previous stage;

a seventh odd TFT between the Q node and the supply voltage terminal, the seventh odd TFT switched according to a voltage of the QB-o node;

a seventh even TFT between the Q node and the supply voltage terminal, the seventh even TFT switched according to a voltage of the QB-e node;

an eighth odd TFT between the output voltage terminal of the present stage and the supply voltage terminal, the eighth odd TFT switched according to the voltage of the QB-o node; and an eighth even TFT between the output voltage terminal of the present stage and the supply voltage terminal, the eighth even TFT switched according to the voltage of the QB-e node.

14. The shift register according to claim 13, wherein the odd source voltage and the even source voltage include pulses having the same period and the opposite phase.

15. The shift register according to claim 14, wherein the period of the pulse is longer than a period of a single frame.

16. The shift register according to claim 13, wherein the first to eighth even TFTs include an n-type amorphous silicon TFT.

17. The shift register according to claim 13, wherein the output voltage of the previous stage for a first stage of the plurality of stages includes a start signal.

18. The shift register according to claim 13, wherein the supply voltage terminal has one of a ground voltage and a low level voltage.

19. A plurality of shift register stages of a driving circuit for a flat panel display device, comprising:
a first thin film transistor (TFT) charging a Q node according to a start signal;
a second TFT discharging the Q node according to an output voltage of a next shift register stage;
a pull-up unit increasing an output voltage of a present shift register stage according to a voltage of the Q node;
an odd pull-down unit decreasing the output voltage of the present stage in an odd frame according to a voltage of a QB-o node;
an even pull-down unit decreasing the output voltage of the present stage in an even frame according to a voltage of a QB-e node;
a third odd TFT connected to the QB-o node, a gate electrode and a drain electrode of the third odd TFT connected to each other and receiving an odd source voltage;
a third even TFT connected to the QB-e node, a gate electrode and a drain electrode of the third even TFT connected to each other and receiving an even source voltage;
a fourth odd TFT connected to the QB-o node, the fourth odd TFT switched according to the even source voltage to discharge the QB-o node: and
a fourth even TFT connected to the QB-e node, the fourth even TFT switched according to the odd source voltage to discharge the QB-e node,
wherein each of the even source voltage and the odd source voltage alternately has a high level voltage by frames, and wherein the even source voltage has an opposite level voltage to the odd source voltage in each frame.

20. The plurality of shift register stages according to claim 19, wherein the start signal includes an output voltage of a previous stage.

21. The plurality of shift register stages according to claim 19, wherein the odd source voltage has a high level voltage during the odd frame and a low level voltage during the even frame, and the even source voltage has a low level voltage during the odd frame and a high level voltage during the even frame.

22. The plurality of shift register stages according to claim 19, wherein the flat panel display device includes a flat panel and the driving circuit, and wherein the plurality of shift register stages are formed in the flat panel.

23. The plurality of shift register stages according to claim 19, wherein the pull-up unit includes a fifth TFT switched according to the voltage of the Q node.

24. A plurality of shift register stages of a driving circuit for a flat panel display device, comprising:
a first thin film transistor (TFT) charging a Q node according to a start signal:
a second TFT discharging the Q node according to an output voltage of a next shift register stage:
a pull-up unit increasing an output voltage of a present shift register stage according to a voltage of the Q node:
an odd pull-down unit decreasing the output voltaae of the present stage in an odd frame according to a voltage of a QB-o node:
an even pull-down unit decreasing the output voltage of the present stage in an even frame according to a voltage of a QB-e node:
a third odd-first TFT connected to the QB-o node, a gate electrode and a drain electrode of the third odd-first TFT connected to each other and receiving an odd source voltage:
a third even-first TFT connected to the QB-e node, a gate electrode and a drain electrode of the third even-first TFT connected to each other and receiving an even source voltage:
a third odd-second TFT between the third odd-first TFT and the QB-o node;
a third even-second TFT between the third even-first TFT and the QB-e node;
a third odd-third TFT connected to the third odd-first TFT and switched according to the voltage of the Q node;
a third even-third TFT connected to the third even-first TFT and switched according to the voltage of the Q node;
a third odd-fourth TFT connected to the third odd-first TFT and switched according to the start signal; and
a third even-fourth TFT connected to the third even-first TFT and switched according to the start signal.

25. A plurality of shift register stages of a driving circuit for a flat panel display device, comprising:
a first thin film transistor (TFT) charging a Q node according to a start signal:
a second TFT discharging the Q node according to an output voltage of a next shift register stage:
a pull-up unit increasing an output voltage of a present shift register stage according to a voltage of the Q node:
an odd pull-down unit decreasing the output voltage of the present stage in an odd frame according to a voltage of a QB-o node:
an even pull-down unit decreasing the output voltaae of the present stage in an even frame according to a voltage of a QB-e node:
a third odd-first TFT connected to the QB-o node, a gate electrode and a drain electrode of the third odd-first TFT connected to each other and receiving an odd source voltage:
a third even-first TFT connected to the QB-e node, a gate electrode and a drain electrode of the third even-first TFT connected to each other and receiving an even source voltage:
a third odd-second TFT between the third odd-first TFT and the QB-o node;
a third even-second TFT between the third even-first TFT and the QB-e node;
a third odd-third TFT connected to the third odd-first TFT and switched according to the voltage of the Q node;
a third even-third TFT connected to the third even-first TFT and switched according to the voltage of the Q node;
a third odd-fourth TFT connected to the third odd-first TFT and switched according to the even source voltage; and a third even-fourth TFT connected to the third even-first TFT and switched according to the odd source voltage.

26. A shift register stage of a driving circuit for a flat panel display device, comprising:
- a first thin-film transistor (TFT) having a gate and drain electrode both connected to a start signal terminal;
- a second TFT connected between the first TFT and a supply voltage, the second TFT having a gate electrode connected to an output of a next stage:
- a third odd-first TFT having a gate and drain electrode both connected to an odd source voltage terminal;
- a third even-first TFT having a gate and drain electrode both connected to an even source voltage terminal;
- a third odd-second TFT connected to the odd voltage terminal and having a gate electrode connected to a source of the third odd-first TFT:
- a third even-second TFT connected to the even voltage terminal and having a gate electrode connected to a source of the third even-first TFT; and
- a fourth TFT connected between a clock terminal and an output node of the shift register stage, a source of the first TFT connected to a gate of the fourth TFT.

27. The shift register stage according to claim 26, wherein the third odd-first and third even-first TFTs are the only TFTs in the shift register whose drain electrodes are directly connected to the odd and even source voltage terminals, respectively.

28. The shift register stage according to claim 26, wherein the supply voltage has one of a ground voltage and a low level voltage.

29. The shift register stage according to claim 26, wherein the clock terminal is the only terminal that supplies a clock signal to the TFTs in the shift register stage.

30. The shift register stage according to claim 26, further comprising a first pair of TFTs connected between a source of the third odd-first TFT and a supply voltage and a second pair of TFTs connected between a source of the third even-first TFT and the supply voltage, a first TFT of the first pair of TFTs and a first TFT of the second pair of TFTs having a gate electrode connected to the gate electrode of the fourth TFT, and a second TFT of the first pair of TFTs and a second TFT of the second pair of TFTs having a gate electrode connected to the start signal terminal.

31. The shift register stage according to claim 26, further comprising a first pair of TFTs connected between a source of the third odd-first TFT and a supply voltage and a second pair of TFTs connected between a source of the third even-first TFT and the supply voltage, a first TFT of the first pair of TFTs and a first TFT of the second pair of TFTs having a gate electrode connected to the gate electrode of the fourth TFT, a second TFT of the first pair of TFTs having a gate electrode connected to the odd voltage terminal, and a second TFT of the second pair of TFTs having a gate electrode connected to the even voltage terminal.

32. The shift register stage according to claim 26, wherein the flat panel display device includes a flat panel and the driving circuit, and wherein the shift register stage is formed in the flat panel.

* * * * *

UNITED STATES PATENT AND TRADEMARK OFFICE
CERTIFICATE OF CORRECTION

PATENT NO.         : 7,528,820 B2                                    Page 1 of 1
APPLICATION NO. : 11/172232
DATED              : May 5, 2009
INVENTOR(S)        : Soo-Young Yoon et al.

It is certified that error appears in the above-identified patent and that said Letters Patent is hereby corrected as shown below:

In column 16, claim 1, line 8, after "wherein a" replace "pate" with --gate--.

In column 20, claim 24, line 9, after "output" replace "voltaae" with --voltage--.

In column 20, claim 25, line 46, after "output" replace "voltaae" with --voltage--.

In column 21, claim 26, line 9, immediately after "stage" replace ":" with --;--.

In column 21, claim 26, line 16, immediately after "odd-first TFT" replace ":" with --;--.

Signed and Sealed this

Twenty-fourth Day of November, 2009

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,528,820 B2 | Page 1 of 1 |
| APPLICATION NO. | : 11/172232 | |
| DATED | : May 5, 2009 | |
| INVENTOR(S) | : Yoon et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 781 days.

Signed and Sealed this
Twenty-ninth Day of March, 2011

David J. Kappos
*Director of the United States Patent and Trademark Office*